(12) United States Patent
Qi et al.

(10) Patent No.: US 11,741,772 B2
(45) Date of Patent: Aug. 29, 2023

(54) DETECTION METHOD, DETECTION APPARATUS AND DETECTION PROCESS (71) Applicant: WEIHAI HUALING OPTO-ELECTRONICS CO., LTD., Shandong (CN)

(72) Inventors: Wuchang Qi, Shandong (CN); Xiaofeng Sun, Shandong (CN); Kai Zhang, Shandong (CN); Li Jiang, Shandong (CN)

(73) Assignee: WEIHAI HUALING OPTO-ELECTRONICS CO., LTD., Shandong (CN)

( * ) Notice: Subject to any disclaimer, the term of this patent is extended or adjusted under 35 U.S.C. 154(b) by 152 days.

(21) Appl. No.: 16/966,479

(22) PCT Filed: Apr. 29, 2019

(86) PCT No.: PCT/CN2019/085023
§ 371 (c)(1),
(2) Date: Jul. 31, 2020

(87) PCT Pub. No.: WO2020/103402
PCT Pub. Date: May 28, 2020

(65) Prior Publication Data
US 2021/0272406 A1 Sep. 2, 2021

(30) Foreign Application Priority Data
Nov. 23, 2018 (CN) .......................... 201811410212.1

(51) Int. Cl.
G06T 7/00 (2017.01)
G07D 7/164 (2016.01)
(Continued)

(52) U.S. Cl.
CPC .............. *G07D 7/164* (2013.01); *G06T 7/90* (2017.01); *G07D 7/04* (2013.01); *G06T 2207/30124* (2013.01)

(58) Field of Classification Search
CPC ........ G07D 7/00; G07D 7/004; G07D 7/0043; G07D 7/0047; G07D 7/005; G07D 7/0051;
(Continued)

(56) References Cited

U.S. PATENT DOCUMENTS 3,703,336 A    11/1972 Rosse et al.

FOREIGN PATENT DOCUMENTS

CN    101631186 A    1/2010
CN    102722933 A    10/2012
(Continued)

*Primary Examiner* — Duy M Dang
(74) *Attorney, Agent, or Firm* — Yu Gang (57) ABSTRACT Provided are a detection method, a detection apparatus and a detection process. The detection method includes: using a sensor for idle scanning to obtain a first output electrical signal, and performing feedback correction on the first output electrical signal to eliminate a noise to obtain first correction data; using the sensor to scan a correction specimen page to obtain a second output electrical signal, and performing the feedback correction on the second output electrical signal to eliminate a noise to obtain second correction data; calculating according to the first correction data, the second correction data and an electrical signal predetermined value to obtain third correction data; using the sensor to scan a to-be-detected object to obtain a third output electrical signal; and correcting the third output electrical signal according to the first correction data and the third correction data. In the detection method obtains an accurate detection result.

20 Claims, 1 Drawing Sheet (51) Int. Cl.
  *G06T 7/90* (2017.01)
  *G07D 7/04* (2016.01)
(58) Field of Classification Search
  CPC .. G07D 7/0053; G07D 7/0054; G07D 7/0055;
        G07D 7/0056; G07D 7/0057; G07D 7/15;
        G07D 7/20; G07D 7/16; G07D 7/164;
        G06V 30/416; G06V 30/46; G06V 10/24;
        G06V 20/90; G06V 20/95; G06V 30/12;
        G06V 10/98; G06T 7/90; G06T
        2207/30124; G06T 2207/30176
  See application file for complete search history.

(56) References Cited

FOREIGN PATENT DOCUMENTS

| | | | |
|---|---|---|---|
| CN | 103152510 | A | 6/2013 |
| CN | 105225332 | A | 1/2016 |
| CN | 105321254 | A | 2/2016 |
| CN | 105652228 | A | 6/2016 |
| CN | 106091910 | A | 11/2016 |
| CN | 106296970 | A | 1/2017 |
| CN | 107063068 | A | 8/2017 |
| CN | 108140271 | A | 6/2018 |
| CN | 109559423 | A | 4/2019 |
| JP | H1191991 | A | 4/1999 |
| JP | 2012016006 | A | 1/2012 |
| KR | 20160102466 | A | 8/2016 |
| KR | 101736569 | B1 | 5/2017 |
| KR | 20170139159 | A | 12/2017 |
| WO | 2007105892 | A1 | 9/2007 |

DETECTION METHOD, DETECTION APPARATUS AND DETECTION PROCESS

CROSS-REFERENCE TO RELATED APPLICATIONS

The present disclosure takes the Chinese Patent Application No. 201811410212.1, filed on Nov. 23, 2018, and entitled "DETECTION METHOD, DETECTION APPARATUS, STORAGE MEDIUM AND PROCESSOR", as the priority, the entire contents of which are incorporated herein by reference.

TECHNICAL FIELD

The present disclosure relates to the field of detection, and in particular to a detection method, a detection apparatus and a detection process.

BACKGROUND

Making special magnetic information or thickness information on a paper currency, a note, a negotiable security and other media has become an important method in modern counterfeiting prevention. There are an increasingly large demand on a sensor and an increasingly high requirement on scanning quality. However, the sensor is affected by a plurality of factors of an external environment such as a temperature, a humidity and a hysteresis in work, and cannot be compensated effectively for elimination, which results in that a scanned image has stripe saturation and other phenomena and the quality of the scanned image is poor to have a great influence on identification and authentic identification.

The existing correction method of the sensor is startup correction mostly, or the sensor is corrected manually as required. In this way, a working state of the sensor before each scanning is inconsistent, so that the scanned image is different from an actual image to greatly affect subsequent identification and judgment and possibly cause misjudgment, missed judgment and other phenomena.

The information disclosed in this background section is only for enhancement of understanding of the background of the present disclosure. Accordingly, the background may include some information, but the information does not form the prior art that is already known to a person skilled in the art in this country.

SUMMARY

A main objective of the present disclosure is to provide a detection method, a detection apparatus, a detection process, a storage medium and a processor, to solve the problem that a correction method of a sensor still cannot obtain a detection result accurately in the conventional art.

To achieve the above objective, according to an aspect of the present disclosure, a detection method is provided, which includes that: a sensor is used for idle scanning to obtain a first output electrical signal, and feedback correction is performed on the first output electrical signal to eliminate a noise of the first output electrical signal to obtain first correction data; the sensor is used to scan a correction specimen page to obtain a second output electrical signal, and the feedback correction is performed on the second output electrical signal to eliminate a noise of the second output electrical signal to obtain second correction data; calculation is performed according to the first correction data, the second correction data and an electrical signal predetermined value to obtain third correction data; the sensor is used to scan a to-be-detected object to obtain a third output electrical signal; and the third output electrical signal is corrected according to the first correction data and the third correction data.

Further, the process that the first correction data, the second correction data and the electrical signal predetermined value are used to calculate to obtain the third correction data includes that: the first correction data is subtracted from the second correction data to obtain a plaintext output, a ratio of the electrical signal predetermined value to the plaintext output being the third correction data, and the electrical signal predetermined value being a voltage corresponding to an expected image gray value.

Further, the process that the third output electrical signal is corrected includes that: the first correction data is subtracted from the third output electrical signal to obtain an effective output electrical signal; and the third correction data is multiplied with the effective output electrical signal to obtain a corrected third output electrical signal.

Further, the sensor includes a sensing element array, the sensing element array includes a plurality of sensing elements, and a process that the first correction data is obtained includes that: step A1, the sensing element is used for performs the idle scanning on one row to obtain a first pre-output electrical signal; step A2, differential amplification is performed on the first pre-output electrical signal; step A3, the amplified first pre-output electrical signal is processed to obtain first feedback correction data; step A4, the first pre-output electrical signal is corrected by the first feedback correction data; and step A5, the differential amplification is performed on a corrected first pre-output electrical signal to obtain a first level of first pre-correction data.

Further, the first pre-correction data has a plurality of levels, and the process that the plurality of levels of the first pre-correction data are obtained further includes that: the step A2 to the step A5 are repeated sequentially at least once to at least obtain a second level of the first pre-correction data.

Further, the step A3 includes that: the amplified first pre-output electrical signal is converted into a first digital signal; subtraction is performed on the first digital signal and a target value to obtain a difference value, thus obtaining first pre-feedback correction data, the target value is an expected image gray value; and the first pre-feedback correction data is converted into an analog signal to obtain the first feedback correction data.

Further, the process that the second correction data is obtained includes that: step B1, the sensing element scans one row of the correction specimen page to obtain a second pre-output electrical signal; step B2, the differential amplification is performed on the second pre-output electrical signal; step B3, the amplified second pre-output electrical signal is processed to obtain second feedback correction data; step B4, the second pre-output electrical signal is corrected by using feedback correction data; and step B5, the differential amplification is performed on a corrected second pre-output electrical signal to obtain a first level of second pre-correction data.

Further, the second pre-correction data has a plurality of levels, and the process that the plurality of levels of the second pre-correction data are obtained further includes that: the step B2 to the step B5 are repeated sequentially at least once to at least obtain a second level of the second pre-correction data.

Further, the step B3 includes that: the amplified second pre-output electrical signal is converted into a second digital signal; subtraction is performed on the second digital signal and a target value to obtain a difference value, thus obtaining second pre-feedback correction data, the target value is an expected image gray value; and the second pre-feedback correction data is converted into an analog signal to obtain the second feedback correction data.

Further, the detection further comprises at least one of a first process and a second process, the first process is a process of obtaining the first correction data, and the first process comprises: N rows are scanned repeatedly to obtain a plurality of each level of the first pre-correction data, N being a positive integer greater than or equal to 2; the plurality of levels of each level of the first pre-correction data are averaged to obtain the first correction data, the second process is a process of obtaining the second correction data, and the second process comprises: N rows are scanned repeatedly to obtain a plurality of each level of the second pre-correction data, N being a positive integer greater than or equal to 2; the plurality of each level of the second pre-correction data are averaged to obtain the first correction data.

Further, the first correction data has a plurality of levels, the second correction data has a plurality of levels, a plurality of levels of the third correction data are obtained by calculating according to the plurality of levels of the first correction data, the plurality of levels of the second correction data and the electrical signal predetermined value, and the plurality of levels of the first correction data and the plurality of levels of the third correction data are used to perform a plurality of levels of correction on the third output electrical signal, and a process of the plurality of levels of correction includes that: step C1, a first level of the first correction data and a first level of the third correction data are used to perform a first level of correction on the third output electrical signal; step C2, a first level of differential amplification is performed on the third output electrical signal after the first level of correction to obtain a first level of correction output signal; step C3, a second level of the first correction data and a second level of the third correction data are used to perform a second level of correction on the first level of correction output signal; step C4, a second level of differential amplification is performed on the third output electrical signal after the second level of correction to obtain a second level of correction output signal; and the step C3 and the step C4 are repeated sequentially at least once, a last level of correction output signal being an output signal after the plurality of levels of correction.

Further, in the plurality of levels of correction, the process of the second level of correction and subsequent each level of correction includes that: a corresponding level of the first correction data is subtracted from each level of correction output signal to obtain the effective output electrical signal; and a corresponding level of the third correction data is multiplied with the effective output electrical signal to obtain a corrected third output electrical signal.

Further, before the first correction data is obtained, the detection method further includes that: startup calibration is performed on the sensor.

According to another aspect of the present disclosure, a detection apparatus is provided, which includes: a sensor, configured to obtain first correction data obtained by idle scanning, obtain second correction data obtained by scanning a correction specimen page, and obtain a third output electrical signal obtained by scanning a to-be-detected object: a correction unit, electrically connected to the sensor, wherein the correction unit includes a calculation component and a correction component electrically connected to the calculation component, the calculation component is configured to calculate according to the first correction data, the second correction data and an electrical signal predetermined value to obtain third correction data, and the correction component is configured to at least correct the third output electrical signal according to the first correction data and the third correction data; and a control unit, electrically connected to the sensor and the correction unit, the control unit being configured to control work of the sensor and the correction unit.

Further, the electrical signal predetermined value is a voltage corresponding to an expected image gray value, and the calculation component includes: a subtraction submodule, electrically connected to the sensor, the subtraction submodule subtracting the first correction data from the second correction data to obtain a plaintext output; and a division submodule, electrically connected to the subtraction submodule, the division submodule using a ratio of the electrical signal predetermined value to the plaintext output to obtain the third correction data.

Further, the correction component includes: a first correction submodule, configured to correct the third output electrical signal according to the first correction data to obtain an effective output electrical signal; and a second correction submodule, configured to multiply with the effective output electrical signal according to the third correction data to obtain a corrected third output electrical signal.

Further, the sensor includes: a body, including a plurality of sensing elements which are sequentially arranged, the body scanning to obtain an output electrical signal; a differential amplification circuit, including a first input end, the first input end being electrically connected to the sensing element, and the differential amplification circuit being configured to differentially amplify the output electrical signal; and a feedback correction circuit, one end of the feedback correction circuit electrically connected to an output end of the differential amplification circuit, and the other end of the feedback correction circuit electrically connected to the first input end, the feedback correction circuit being configured to obtain feedback correction data, and perform, by using the feedback correction data, feedback correction on an output electrical signal when the idle scanning is performed on the body and an output electrical signal when the body scans the correction specimen page, and an output electrical signal after the feedback correction being respectively input to the first input end for the differential amplification to obtain the first correction data or the second correction data.

Further, the sensor comprises a plurality of the differential amplification circuits, the plurality of differential amplification circuits are sequentially and serially connected, and the first input end of a first differential amplification circuit in the plurality of differential amplification circuits is electrically connected to the sensing element; and the sensor comprises a plurality of feedback correction circuits are provided, and each feedback correction circuit is electrically connected to the differential amplification circuits in one-to-one correspondence.

Further, the sensor is a magnetic sensor or a thickness sensor.

According to still another aspect of the present disclosure, a detection process is provided; the detection process includes a plurality of detection steps; each detection step is configured to detect a to-be-detected object; and each detection step is implemented by using the above-mentioned any detection method.

According to still another aspect of the present disclosure, a storage medium is provided; the storage medium includes a stored program; and the program runs to control a device, where the storage medium is located, to execute the above-mentioned any detection method.

According to still another aspect of the present disclosure, a processor is provided; the processor is configured to run a program; and the program runs to execute the above-mentioned any detection method.

By applying the technical solutions of the present disclosure, in the above detection method, the feedback correction data, the first correction data and the third correction data are all obtained in advance before the to-be-detected object is scanned during each detection; and after the to-be-detected object is scanned to obtain the third output electrical signal, the third output electrical signal is corrected by using the first correction data and the third correction data. Even though a working state of the sensor is inconsistent before each detection, the detection method obtains the feedback correction data, the first correction data and the third correction data corresponding to a current working state of the sensor before scanning the to-be-detected object each time, and corrects, in real time, the electrical signal obtained by scanning the to-be-detected object, thus obtaining an accurate detection result. Therefore, the problem of an inaccurate detection result of a correction method due to the inconsistent working state of the sensor before each scanning in the conventional art is prevented.

BRIEF DESCRIPTION OF THE DRAWINGS

The accompanying drawings formed into a part of the present disclosure are described here to provide a further understanding of the present disclosure. The schematic embodiments and description of the present disclosure are adopted to explain the present disclosure, and do not form improper limits to the present disclosure. In the drawings.

The drawings include the following reference signs:
01. scanned object, 10. sensor, 20. correction unit, 11. body, 110. sensing element, 12. differential amplification circuit, 13. feedback correction circuit, 131. first analog-digital conversion component, 132. processing component, 133. second analog-digital conversion component, 14. resistor, 30. first sensing element, 40. second sensing element, and 50. rolling shaft.

DETAILED DESCRIPTION OF THE EMBODIMENTS

It is to be noted that the following detailed description is illustrative and is intended to provide further illustration for the present disclosure. Unless otherwise specified, all technical and scientific terms used in the specification have a same meaning generally understood by the person skilled in the art of the present disclosure.

It is to be noted that terms used herein only aim to describe specific implementation manners, and are not intended to limit exemplar implementations of this disclosure. As used herein, unless otherwise directed by the context explicitly, singular forms of terms are intended to include plural forms. Besides, it will be also appreciated that when terms "contain" and/or "include" are used in the description, it is indicated that features, steps, operations, devices, assemblies and/or a combination thereof exist.

It is to be understood that when an element (such as a layer, a film, a region, or a substrate) is described as being "on" another element, the element may be directly on the other element, or an intermediate element may also be present therebetween. Moreover, when an element is described as being "connected" to another element in the specification and claims, the element may be "directly connected" to the other element, or "connected" to the other element via a third element.

With a sensor for example, as mentioned in background, in an existing detection process by the sensor, a correction method is startup correction mostly, or the sensor is corrected manually as required. In this way, a working state of the sensor before each scanning is inconsistent, so that a scanned image is different from an actual image to greatly affect subsequent identification and judgment, possibly cause misjudgment, missed judgment and the like, and result in that a detection result is not accurate enough. In order to solve the above technical problem, the present disclosure provides a detection method, a detection apparatus, a detection process, a storage medium and a processor.

In a typical implementation mode of the present disclosure, a detection method is provided, which includes that: a sensor is used for idle scanning to obtain a first output electrical signal, and feedback correction is performed on the first output electrical signal to eliminate a noise of the first output electrical signal to obtain first correction data; the sensor is used to scan a correction specimen page to obtain a second output electrical signal, and the feedback correction is performed on the second output electrical signal to eliminate a noise of the second output electrical signal to obtain second correction data; calculation is performed according to the first correction data, the second correction data and an electrical signal predetermined value to obtain third correction data; the sensor is used to scan a to-be-detected object to obtain a third output electrical signal; and the third output electrical signal is corrected according to the first correction data and the third correction data.

In the above detection method, the first correction data and the third correction data are obtained during each detection; and after the to-be-detected object is scanned to obtain the third output electrical signal, the third output electrical signal is corrected by using the first correction data and the third correction data. Even though a working state of the sensor is inconsistent during each detection, the detection method obtains the feedback correction data, the first correction data and the third correction data corresponding to a current working state of the sensor during each detection, and corrects, in real time according to the third correction data, the electrical signal obtained by scanning the to-be-detected object, thus obtaining an accurate detection result. Therefore, the problem of an inaccurate detection result of a correction method due to the inconsistent working state of the sensor before each scanning in the conventional art is prevented, the difference in the scanned image caused by a change of an external environment is greatly reduced, and the detection result is more accurate.

It is to be noted that, in the detection method, the step of obtaining the feedback correction data, the first correction data and the third correction data is unvarying, i.e., the feedback correction data is obtained first, then the first correction data is obtained according to the first output electrical signal after the feedback correction, and then, the third correction data is obtained according to the first correction data.

In a specific embodiment of the present disclosure, after the feedback correction, the process that the first correction data, the second correction data and the electrical signal predetermined value are used to calculate to obtain the third correction data includes that: the first correction data is subtracted from the second correction data to obtain a plaintext output, a ratio of the electrical signal predetermined value to the plaintext output is the third correction data, and the electrical signal predetermined value is a voltage corresponding to an expected image gray value. For example, the first correction data is Vd, the second output electrical signal is Vp, the electrical signal predetermined value is 255, and the third correction data is 255/(Vp−d).

In order to further obtain accurate detection data, in some embodiments of the present disclosure, the process that the third output electrical signal is corrected includes that: the first correction data is subtracted from the third output electrical signal to obtain an effective output electrical signal; and the third correction data is multiplied with the effective output electrical signal to obtain a corrected third output electrical signal. When there is only either the first correction data or the third correction data, the third output electrical signal is only corrected once, and such a correction process consists of the above steps. When the first correction data and the third correction data have a plurality of levels, the third output electrical signal is sequentially subjected to a plurality of levels of correction. The first level of correction is performed according the above steps, and the subsequent levels of correction are also performed according to the above steps basically. However, the third output electrical signal is a signal output by the subsequent each level of correction, and the first correction data and the third correction data are corresponding levels of correction data.

In some other embodiments of the present disclosure, the sensor includes a sensing element array, the sensing element array includes a plurality of sensing elements, and a process that the first correction data is obtained includes that: step A1, the sensing element performs the idle scanning on one row to obtain a first pre-output electrical signal; step A2, differential amplification is performed on the first pre-output electrical signal; step A3, an amplified first pre-output electrical signal is processed to obtain first feedback correction data; step A4, the first pre-output electrical signal is corrected using the first feedback correction data; and step A5, the differential amplification is performed on a corrected first pre-output electrical signal to obtain a first level of first pre-correction data.

In the embodiments, the feedback correction data obtained after the amplified output signal is processed is used to correct an input signal, and the differential amplification is performed on the corrected input signal to obtain a corrected output signal, so after the feedback correction, the influence of an environmental noise on the output signal is greatly reduced, and the electrical signal output by each sensing element becomes consistent after being amplified. When the process that the first correction data is obtained only consists of the above steps A1 to A5, the first level of the first pre-correction data is the first correction data; and the third correction data is obtained by using the first correction data, thus correcting the third output electrical signal.

Certainly, the feedback correction in the present disclosure is not limited to one level, and may have a plurality of levels, that is, a plurality of levels of differential amplification are performed on the first pre-output signal output by the sensing element, the output at each level is used to correct the input, and at last, the corrected electrical signal after the differential amplification to obtain the corrected output signal; and the corrected output signal serves as an input electrical signal of a next level of differential amplification circuit.

In some specific embodiments of the present disclosure, the first pre-correction data has a plurality of levels, and the process that the plurality of levels of the first pre-correction data are obtained further includes that: the step A2 to the step A5 are repeated sequentially at least once to at least obtain a second level of the first pre-correction data. That is, after the first step A5, a first level of the first pre-correction data is obtained, and then, the steps A2 to A5 are executed sequentially at least once to obtain at least second level of the first pre-correction data. In this way, when a detected object is detected, the plurality of levels of the first pre-correction data can be used to obtain a plurality of third correction data, and the plurality of third correction data are used to correct a plurality of third output electrical signals respectively. Therefore, the detected signal can reach a required output amplitude, the influence of other interferences on the signal is reduced greatly, and the output is more accurate.

In order to improve the efficiency of the step A3, and obtain more accurate feedback correction data, in an embodiment of the present disclosure, the step A3 includes that: the amplified first pre-output electrical signal is converted into a first digital signal; subtraction is performed on the first digital signal and a target value to obtain a difference value, thus obtaining first pre-feedback correction data, the target value is an expected image gray value; and the first pre-feedback correction data is converted into an analog signal to obtain the feedback correction data.

Certainly, the step A3 of the present disclosure is not limited to the above process, and may further be other processes in the conventional art, provided that the feedback correction data can be obtained. The person skilled in the art can select an appropriate processing method according to an actual condition to obtain the feedback correction data.

In order to further obtain more accurate third correction data and make a final detection result more accurate, in some embodiments of the present disclosure, the sensor includes the sensing element array, the sensing element array includes the plurality of sensing elements, and the process that the second correction data is obtained includes that: step B1, the sensing element scans one row of the correction specimen page to obtain a second pre-output electrical signal; step B2, the differential amplification is performed on the second pre-output electrical signal; step B3, the amplified second pre-output electrical signal is processed to obtain feedback correction data; step B4, the second pre-output electrical signal is corrected by using the feedback correction data; and step B5, the differential amplification is performed on a corrected second pre-output electrical signal to obtain a first level of second pre-correction data.

When the process that the first correction data is obtained only consists of the above steps B1 to B5, the first level of the second pre-correction data is the second correction data; and the third correction data is obtained according to the second correction data, thus correcting the third output electrical signal.

In some specific embodiments of the present disclosure, the second pre-correction data has a plurality of levels, and the process that the plurality of levels of the second pre-correction data are obtained further includes that: the step B2 to the step B5 are repeated sequentially at least once to at least obtain a second level of the first pre-correction data. That is, after the first step B5, a first level of the second pre-correction data is obtained, and then, the steps B2 to B5 are executed sequentially at least once to obtain at least second level of the second pre-correction data. In this way, when a detected object is detected, a plurality of levels of the second pre-correction data may be used to obtain a plurality of pieces of third correction data, and the plurality of third correction data are used to correct a plurality of third output electrical signals respectively. Therefore, the detected signal can reach a required output amplitude, the influence of other interferences on the signal is reduced greatly, and the output is more accurate.

In order to improve the efficiency of the step B3, and obtain more accurate feedback correction data, in some embodiments of the present disclosure, the step B3 includes that: the amplified second pre-output electrical signal is converted into a second digital signal; the subtraction is performed on the second digital signal and a target value to obtain a difference value, thus obtaining second pre-feedback correction data, the target value is an expected image gray value; and the second pre-feedback correction data is converted into an analog signal to obtain the feedback correction data.

Certainly, the step B3 of the present disclosure is not limited to the above process, and may further be other processes in the conventional art, provided that the feedback correction data can be obtained. The person skilled in the art may select an appropriate processing method according to an actual condition to obtain the feedback correction data.

In order to obtain more accurate each level of correction data, in some embodiments of the present disclosure, the detection further includes at least one of a first process and a second process, the first process is a process of obtaining the first correction data, and the first process includes: N rows are scanned repeatedly to obtain a plurality of each level of the first pre-correction data, N is a positive integer greater than or equal to 2; and the plurality of each level of the first pre-correction data are averaged to obtain the each level of the first correction data, the second process is a process of obtaining each level of second correction data, and the second process includes: N rows are scanned repeatedly to obtain a plurality of each level of the second pre-correction data, N is a positive integer greater than or equal to 2; and the plurality of each level of the second pre-correction data are averaged to obtain the each level of the second correction data. For example, when the first correction data is obtained, 3 rows are scanned repeatedly, and after three times of the steps A1 to A5, three first level of the first pre-correction data are obtained; and then, the three first level of the first pre-correction data are averaged to obtain the first level of the first correction data.

In some embodiments of the present disclosure, the first correction data has a plurality of levels, the second correction data has a plurality of levels, a plurality of levels of the third correction data are obtained by calculating according to the plurality of levels of the first correction data, the plurality of levels of the second correction data and the electrical signal predetermined value, and the plurality of levels of the first correction data and the plurality of levels of the third correction data are used to perform a plurality of levels of correction on the third output electrical signal, and the process of the plurality of levels of correction includes that: step C1, a first level of the first correction data and a first level of the third correction data are used to perform a first level of correction on the third output electrical signal; step C2, a first level of differential amplification is performed on the third output electrical signal after the first level of correction to obtain a first level of correction output signal; step C3, a second level of the first correction data and a second level of the third correction data are used to perform a second level of correction on the first level of the correction output signal; step C4, a second level of differential amplification is performed on the third output electrical signal after the second level of correction to obtain a second level of correction output signal; and the step C3 and the step C4 are repeated sequentially at least once, i.e., a third level of correction is performed at least, which specifically includes that: a third level of the first correction data and a third level of the third correction data are used to perform the third level of correction; and a third level of differential amplification is performed on the third output electrical signal after the third level of correction to obtain a third level of corrected output signal. The repeated process is to perform a next level of correction on an output signal obtained by a previous level of correction, and the differential amplification is performed on the corrected signal; and a last level of corrected output signal is an output signal after the plurality of levels of correction.

Specifically, in the plurality of levels of correction, the process for the first level of correction may be performed according to the steps mentioned above, and the process for the second level of correction and subsequent each level of correction is basically consistent with the process for the first level of correction. However, the third output electrical signal is a signal output by each level, and the first correction data and the third correction data are corresponding levels of the correction data. Specifically, the process for the subsequent levels of correction includes that: a corresponding level of the first correction data is subtracted from each level of correction output signal to obtain an effective output electrical signal; and a corresponding level of the third correction data is multiplied with the effective output electrical signal to obtain a corrected third output electrical signal.

In order to further obtain the accurate detection result, in an embodiment of the present disclosure, before the first correction data is obtained, the detection method further includes that: startup calibration is performed on the sensor.

The startup calibration is startup calibration defined by a device manufacturer.

In some other embodiments of the present disclosure, a detection apparatus is provided, which includes: a sensor 10, a correction unit 20 and a control unit; the sensor 10 is configured to obtain first correction data obtained by idle scanning, obtain second correction data obtained by scanning a correction specimen page, and obtain a third output electrical signal obtained by scanning a to-be-detected object: the correction unit 20 is electrically connected to the sensor 10; the correction unit 20 includes a calculation component and a correction component electrically connected to the calculation component, the calculation component is configured to calculate according to the first correction data, the second correction data and an electrical signal predetermined value to obtain third correction data, and the correction component is configured to at least correct the third output electrical signal according to the first correction data and the third correction data; and the control unit is electrically connected to the sensor and the correction unit, and the control unit is configured to control work of the sensor and the correction unit.

In the detection apparatus, the sensor, the correction unit and the control unit are included; and during each detection, the sensor obtains the feedback correction data, the first correction data and the third correction data; and after the to-be-detected object is scanned to obtain the third output electrical signal, the correction unit uses the first correction data and the third correction data to correct the third output electrical signal. Even though a working state of the sensor is inconsistent during each detection, the detection apparatus obtains the feedback correction data, the first correction data and the third correction data corresponding to a current working state of the sensor during each detection, and corrects, in real time, the electrical signal obtained by scanning the to-be-detected object, thus obtaining an accurate detection result. Therefore, the problem of an inaccurate detection result of a detection apparatus due to the inconsistent working state of the sensor before each scanning in the conventional art is prevented, the difference in the scanned image caused by a change of an external environment is greatly reduced, and the detection result is more accurate.

In some specific embodiments of the present disclosure, the electrical signal predetermined value is a voltage corresponding to an expected image gray value, the calculation component includes a subtraction submodule and a division submodule, the subtraction submodule is electrically connected to the sensor, and the subtraction submodule subtracts the first correction data from the second correction data to obtain a plaintext output; and the division submodule is electrically connected to the subtraction submodule, and the division submodule uses a ratio of the electrical signal predetermined value to the plaintext output to obtain the third correction data.

In order to further obtain accurate detection data, in some embodiments of the present disclosure, the correction component includes a first correction submodule and a second correction submodule; the first correction submodule is configured to correct the third output electrical signal according to the first correction data to obtain an effective output electrical signal; and the second correction submodule is configured to multiply with the effective output electrical signal according to the third correction data to obtain a corrected third output electrical signal.

Figure 1:
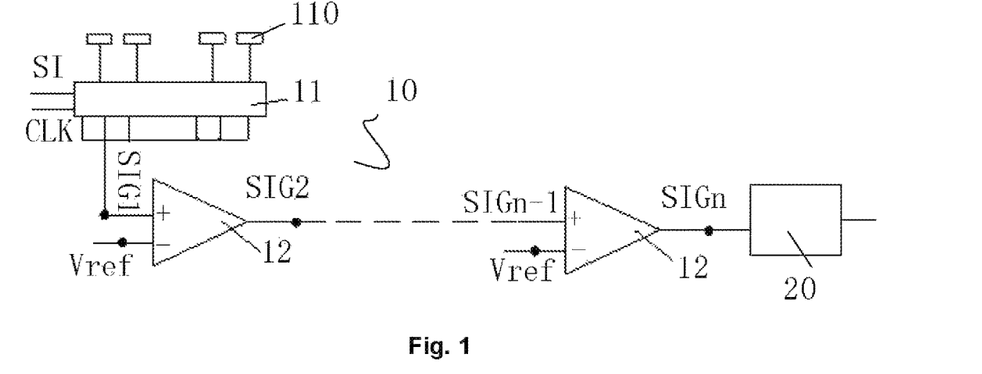
FIG. 1 illustrates a structural schematic diagram according to an embodiment of a detection apparatus of the present disclosure.

In another embodiment of the present disclosure, as shown in FIG. 1, the sensor 10 includes a body 11, a differential amplification circuit 12 and a feedback correction circuit 13. The body 11 includes a plurality of sensing elements 110 which are sequentially arranged; the body 11 scans to obtain an output electrical signal; when the body performs the idle scanning (i.e., scanning without any to-be-scanned object), a first output electrical signal is obtained; the body is used to scan the correction specimen page to obtain a second output electrical signal, and the sensor is used to scan the to-be-detected object to obtain the third output electrical signal; the differential amplification circuit 12 includes a first input end, the first input end is electrically connected to the sensing element 110, and the differential amplification circuit 12 is configured to perform differential amplification on the output electrical signal; and the feedback correction circuit 13 has one end electrically connected to an output end of the differential amplification circuit 12, and the other end electrically connected to the first input end, the feedback correction circuit 13 is configured to obtain feedback correction data, and perform, by using the feedback correction data, feedback correction on the output electrical signal when the idle scanning is performed on the body and the output electrical signal when the body scans the correction specimen page, and an output electrical signal after the feedback correction is respectively input to the first input end for the differential amplification to obtain the first correction data or the second correction data. In the embodiment, the feedback correction data obtained after the amplified output signal is processed is used to correct an input signal, and the differential amplification is performed on the corrected input signal to obtain a corrected output signal, so after the feedback correction, the electrical signal output by each sensing element becomes consistent after being amplified.

Certainly, the feedback correction of the present disclosure is not limited to one level, and may have a plurality of levels as shown in FIG. 1, i.e., a plurality of differential amplification circuits 12 are provided, a plurality of feedback correction circuits 13 are provided, the plurality of differential amplification circuits 12 are sequentially and serially connected, and the first input end of a first differential amplification circuit in the plurality of differential amplification circuits 12 is electrically connected to the sensing element 110; and each feedback correction circuit 13 is electrically connected to the differential amplification circuits 12 in one-to-one correspondence. When the electrical signal output by the sensing element is the first output electrical signal or the second output electrical signal, the control unit controls each feedback correction circuit to perform the feedback correction on the first output electrical signal or the second output electrical signal output by the connected differential amplification circuit; and the corrected output signal serves as an input electrical signal of a next differential amplification circuit 12. Such a detection apparatus obtains more accurate feedback correction data. In a structure shown in FIG. 2, output signals of the plurality of differential amplification circuits 12 are SIG1, SIG2, SIG3, . . . SIGn−1 and SIGn sequentially, a last output signal SIGn−1 of an (n−1)th differential amplification circuit 12 serves as an input signal of an nth differential amplifier, the signal after the differential amplification to obtain SIGn', the SIGn' is processed by the feedback correction circuit 13 to obtain feedback correction data, the data corrects the SIGn−1, and the corrected SIGn−1 after the differential amplification to obtain the SIGn.

Figure 2:
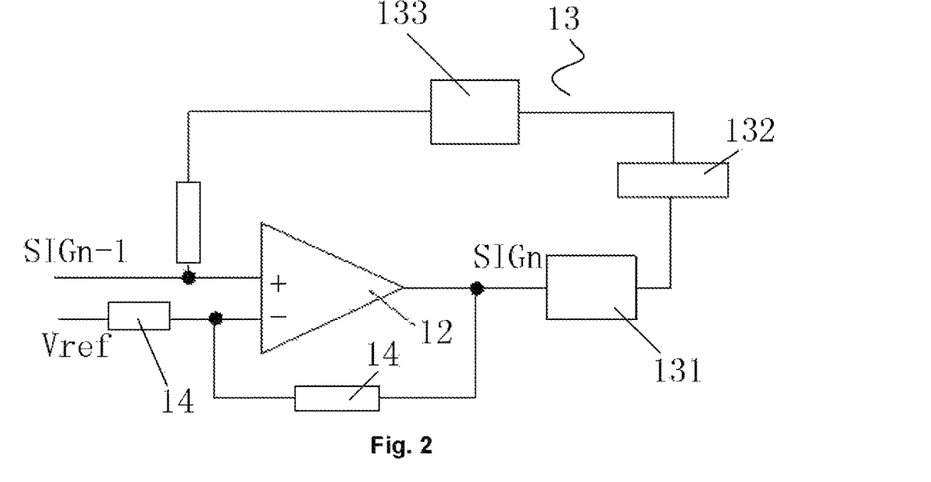
FIG. 2 illustrates a local structural schematic diagram in another detection apparatus.

It is to be noted that the feedback correction circuit only performs the feedback correction on the first output electrical signal amplified by the differential amplification circuit and the second output electrical signal amplified by the differential amplification circuit, and does not perform the feedback correction on the third output electrical signal amplified by the differential amplification circuit. Specifically, the control unit controls a working process of the feedback correction circuit; and when the electrical signal output by the sensing element is the third output electrical signal, the control unit controls the feedback correction circuit not to work, i.e., the feedback correction is not performed on the third output electrical signal after the differential amplification of the differential amplification circuit.

In a specific embodiment of the present disclosure, as shown in FIG. 2, the feedback correction circuit 13 includes a first analog-digital conversion component 131, a processing component 132 and a second analog-digital conversion 133 that are sequentially and serially connected. The first analog-digital conversion component is electrically connected to the output end of the differential amplification circuit, and configured to convert the output electrical signal after the differential amplification into a digital signal, and the digital signal is input to the processing component 132 for processing to obtain pre-feedback correction data. A specific processing process may be that the digital signal is operated to obtain a difference value that makes a corresponding digital signal output value output by each point basically reach a same target value, thus obtaining the pre-feedback correction data, and the target value is the expected image gray value; and thereafter, the second analog-digital conversion component 133 converts the pre-feedback correction data into an analog signal to obtain the feedback correction data. In the embodiment, the structure of the feedback correction circuit is simple, and the more accurate feedback correction data is obtained. As shown in FIG. 2, a resistor 14 is further provided between the output end and the input end, the resistor 14 is also provided on the input end, resistances of the two resistors may be the same and may also be different, and may be determined specifically according to an actual condition.

Figure 3:
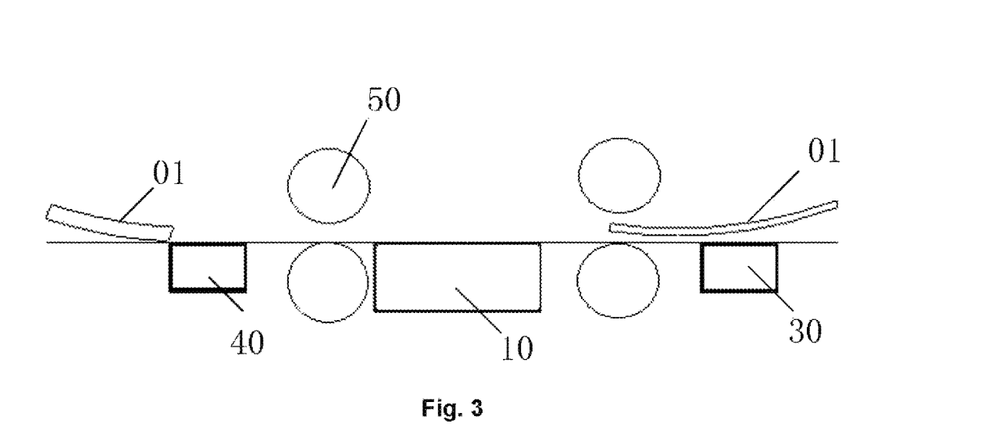
FIG. 3 illustrates a structural schematic diagram of still another detection apparatus in the present disclosure.

In a specific embodiment of the present disclosure, the detection apparatus further includes two sensing elements, which are a first sensing element 30 and a second sensing element 40 respectively; as shown in FIG. 3, the two sensing elements are respectively located on two ends of the sensor 10 and arranged at intervals with the sensor 10; and the detection apparatus further includes a rolling shaft 50, and the rolling shaft 50 makes a scanned object 01 attached to the sensor 10 tightly. A magnetic sensor is started up for correction. When the first sensing element 30 senses the passing of an object, the sensor 10 starts to work, and the object is tightly attached to the sensor 10 via the rolling shaft 50 for scanning. When the second sensing element 40 senses that the scanned object 01 is scanned completely, it corrects the output data of the sensor 10 right now, and completes the correction before the coming of a new scanning manuscript. Herein, the scanning manuscript may have different sizes, and the correction time after each object is scanned is the same. The scanning time and the correction time form detection time of the to-be-detected object.

In still another embodiment of the present disclosure, a detection process is provided; the detection process includes a plurality of detection steps; each detection step is configured to detect a to-be-detected object; and each detection step is implemented by using the above-mentioned any detection method of the present disclosure. That is, when each to-be-detected object is detected, the following steps are at least executed once:

a sensor is used for idle scanning to obtain a first output electrical signal, and feedback correction is performed on the first output electrical signal to eliminate a noise of the first output electrical signal to obtain first correction data;

the sensor is used to scan a correction specimen page to obtain a second output electrical signal, and the feedback correction is performed on the second output electrical signal to eliminate a noise of the second output electrical signal to obtain second correction data;

calculation is performed according to the first correction data, the second correction data and an electrical signal predetermined value to obtain third correction data;

the sensor is used to scan the to-be-detected object to obtain a third output electrical signal;

the third output electrical signal is corrected according to the first correction data and the third correction data.

When detecting each to-be-detected object, the detection process obtains the feedback correction data, the first correction data and the third correction data corresponding to a current working state of the sensor, and corrects, in real time according to the first correction data and the third correction data, the electrical signal obtained by scanning the to-be-detected object, thus obtaining an accurate detection result. Therefore, the problem of an inaccurate detection result of a correction method due to the inconsistent working state of the sensor before each scanning in the conventional art is prevented, the difference in the scanned image caused by a change of an external environment is greatly reduced, and the detection result is more accurate.

In some other embodiments of the present disclosure, a storage medium is provided; the storage medium includes a stored program; and the program runs to control a device, where the storage medium is located, to execute the above-mentioned any detection method.

In some other embodiments of the present disclosure, a processor is provided: the processor is configured to run a program; and the program runs to execute the above-mentioned any detection method.

As can be seen from the above description, the above embodiments of the present disclosure implement the following technical effects:

1) In the above detection method, the feedback correction data, the first correction data and the third correction data are obtained during each detection; and after the to-be-detected object is scanned to obtain the third output electrical signal, the third output electrical signal is corrected by using the first correction data and the third correction data. Even though a working state of the sensor is inconsistent during each detection, the detection method obtains the feedback correction data, the first correction data and the third correction data corresponding to a current working state of the sensor during each detection, and corrects, in real time according to the first correction data and the third correction data, the electrical signal obtained by scanning the to-be-detected object, thus obtaining an accurate detection result. Therefore, the problem of an inaccurate detection result of a correction method due to the inconsistent working state of the sensor before each scanning in the conventional art is prevented, the difference in the scanned image caused by a change of an external environment is greatly reduced, and the detection result is more accurate.

2) The detection apparatus of the present disclosure includes the sensor and the correction unit; and during each detection, the sensor obtains the feedback correction data, the first correction data and the third correction data, and uses, after scanning the to-be-detected object to obtain the third output electrical signal, the first correction data and the third correction data to correct the third output electrical signal. Even though a working state of the sensor is inconsistent during each detection, the detection apparatus obtains the feedback correction data, the first correction data and the third correction data corresponding to a current working state of the sensor during each detection, and corrects, in real time, the electrical signal obtained by scanning the to-be-detected object, thus obtaining an accurate detection result. Therefore, the problem of an inaccurate detection result of a detection apparatus due to the inconsistent working state of the sensor before each scanning in the conventional art is prevented, the difference in the scanned image caused by a change of an external environment is greatly reduced, and the detection result is more accurate.

The above are only preferred embodiments of the present disclosure and should not be used for limiting the present disclosure. For the person skilled in the art, the present disclosure may have various modifications and changes. Any modifications, equivalent replacements, improvements and the like within the spirit and principle of the present disclosure shall fall within the scope of protection of the present disclosure.

What is claimed is:

1. A detection method, comprising:
    using a sensor for idle scanning to obtain a first output electrical signal, and performing feedback correction on the first output electrical signal to eliminate a noise of the first output electrical signal to obtain first correction data;
    using the sensor to scan a correction specimen page to obtain a second output electrical signal, and performing the feedback correction on the second output electrical signal to eliminate a noise of the second output electrical signal to obtain second correction data;
    calculating third correction data according to the first correction data, the second correction data and an electrical signal predetermined value;
    using the sensor to scan a to-be-detected object to obtain a third output electrical signal; and
    correcting the third output electrical signal according to the first correction data and the third correction data.

2. The detection method as claimed in claim 1, wherein calculating the third correction data according to the first correction data, the second correction data and the electrical signal predetermined value comprises: subtracting the first correction data from the second correction data to obtain a plaintext output, a ratio of the electrical signal predetermined value to the plaintext output being the third correction data, and the electrical signal predetermined value being a voltage corresponding to an expected image gray value.

3. The detection method as claimed in claim 1, wherein correcting the third output electrical signal comprises:
    subtracting the first correction data from the third output electrical signal to obtain an effective output electrical signal; and
    multiplying the third correction data with the effective output electrical signal to obtain a corrected third output electrical signal.

4. The detection method as claimed in claim 3, wherein the sensor comprises a sensing element array, the sensing element array comprises a plurality of sensing elements, and a process of obtaining the first correction data comprises:
    step A1, using the sensing element for the idle scanning on one row to obtain a first pre-output electrical signal;
    step A2, differentially amplifying the first pre-output electrical signal;
    step A3, processing an amplified first pre-output electrical signal to obtain first feedback correction data;
    step A4, correcting the first pre-output electrical signal by the first feedback correction data; and
    step A5, differentially amplifying a corrected first pre-output electrical signal to obtain a first level of first pre-correction data.

5. The detection method as claimed in claim 4, wherein the first pre-correction data has a plurality of levels, and the process of obtaining the plurality of levels of the first pre-correction data further comprises:
    repeating the step A2 to the step A5 sequentially at least once to at least obtain a second level of the first pre-correction data.

6. The detection method as claimed in claim 4, wherein the step A3 comprises:
    converting the amplified first pre-output electrical signal into a first digital signal;
    performing subtraction on the first digital signal and a target value to obtain a difference value, thus obtaining first pre-feedback correction data, the target value being an expected image gray value; and
    converting the first pre-feedback correction data into an analog signal to obtain the first feedback correction data.

7. The detection method as claimed in claim 5, wherein the process of obtaining the second correction data comprises:
    step B1, using the sensing element to scan one row of the correction specimen page to obtain a second pre-output electrical signal;
    step B2, differentially amplifying the second pre-output electrical signal;
    step B3, processing the amplified second pre-output electrical signal to obtain second feedback correction data;
    step B4, correcting the second pre-output electrical signal by the feedback correction data; and
    step B5, differentially amplifying a corrected second pre-output electrical signal to obtain a first level of second pre-correction data.

8. The detection method as claimed in claim 7, wherein the second pre-correction data has a plurality of levels, and the process of obtaining the plurality of levels of the second pre-correction data further comprises:
    repeating the step B2 to the step B5 sequentially at least once to at least obtain a second level of the second pre-correction data.

9. The detection method as claimed in claim 7, wherein the step B3 comprises:
    converting the amplified second pre-output electrical signal into a second digital signal;
    performing subtraction on the second digital signal and a target value to obtain a difference value, thus obtaining second pre-feedback correction data, the target value being an expected image gray value; and
    converting the second pre-feedback correction data into an analog signal to obtain the second feedback correction data.

10. The detection method as claimed in claim 8, wherein the detection further comprises at least one of a first process and a second process,
    the first process is a process of obtaining each level of the first correction data, and the first process comprises:
    scanning N rows repeatedly to obtain a plurality of each level of the first pre-correction data, N being a positive integer greater than or equal to 2;
    averaging the plurality of each level of the first pre-correction data to obtain the each level of the first correction data,
    the second process is a process of obtaining each level of second correction data, and the second process comprises:
    scanning N rows repeatedly to obtain a plurality of each level of the second pre-correction data, N being a positive integer greater than or equal to 2,
    averaging the plurality of each level of the second pre-correction data to obtain the each level of second correction data.

11. The detection method as claimed in claim 4, wherein the first correction data has a plurality of levels, the second correction data has a plurality of levels, a plurality of levels of the third correction data are obtained by calculating according to the plurality of levels of the first correction data, the plurality of levels of the second correction data and the electrical signal predetermined value, and the plurality of levels of the first correction data and the plurality of levels of the third correction data are used to perform a plurality of levels of correction on the third output electrical signal, and a process of the plurality of levels of correction comprises:

step C1, using a first level of the first correction data and a first level of the third correction data to perform a first level of correction on the third output electrical signal;

step C2, performing a first level of differential amplification on the third output electrical signal after the first level of correction to obtain a first level of correction output signal;

step C3, using a second level of the first correction data and a second level of the third correction data to perform a second level of correction on the first level of correction output signal;

step C4, performing a second level of differential amplification on the third output electrical signal after the second level of correction to obtain a second level of correction output signal; and repeating the step C3 and the step C4 sequentially at least once, a last level of correction output signal being an output signal after the plurality of levels of correction.

12. The detection method as claimed in claim 11, wherein in the plurality of levels of correction, the process of the second level of correction and subsequent each level of correction comprises:

subtracting a corresponding level of the first correction data from each level of correction output signal to obtain the effective output electrical signal; and multiplying a corresponding level of the third correction data with the effective output electrical signal to obtain a corrected third output electrical signal.

13. The detection method as claimed in claim 1, wherein before the first correction data is obtained, the detection method further comprises:

performing startup calibration on the sensor.

14. A detection process, comprising a plurality of detection steps, each detection step being configured to detect a to-be-detected object, wherein each detection step is implemented by using a detection method as claimed in claim 1.

15. A detection apparatus, comprising:

a sensor, configured to obtain first correction data obtained by idle scanning, obtain second correction data obtained by scanning a correction specimen page, and obtain a third output electrical signal obtained by scanning a to-be-detected object;

a correction circuit, electrically connected to the sensor, wherein the correction circuit comprises a calculation component and a correction component electrically connected to the calculation component, the calculation component is configured to calculate third correction data according to the first correction data, the second correction data and an electrical signal predetermined value, and the correction component is configured to at least correct the third output electrical signal according to the first correction data and the third correction data; and a control circuit, electrically connected to the sensor and the correction circuit, the control circuit being configured to control work of the sensor and the correction circuit.

16. The detection apparatus as claimed in claim 15, wherein the electrical signal predetermined value is a voltage corresponding to an expected image gray value, and the calculation component comprises:

a subtraction submodule, electrically connected to the sensor, the subtraction submodule subtracting the first correction data from the second correction data to obtain a plaintext output; and a division submodule, electrically connected to the subtraction submodule, the division submodule being calculated a ratio of the electrical signal predetermined value to the plaintext output to obtain the third correction data.

17. The detection apparatus as claimed in claim 15, wherein the correction component comprises:

a first correction submodule, configured to correct the third output electrical signal according to the first correction data to obtain an effective output electrical signal; and a second correction submodule, configured to multiply with the effective output electrical signal according to the third correction data to obtain a corrected third output electrical signal.

18. The detection apparatus as claimed in claim 15, wherein the sensor comprises:

a body, comprising a plurality of sensing elements which are sequentially arranged, the body scanning to obtain an output electrical signal;

a differential amplification circuit, comprising a first input end, the first input end being electrically connected to the sensing element, and the differential amplification circuit being configured to differentially amplify the output electrical signal; and a feedback correction circuit, one end of the feedback correction circuit electrically connected to an output end of the differential amplification circuit, and the other end of the feedback correction circuit electrically connected to the first input end, the feedback correction circuit being configured to obtain feedback correction data, and perform, by using the feedback correction data, feedback correction on an output electrical signal when the idle scanning is performed on the body and an output electrical signal when the body scans the correction specimen page, and an output electrical signal after the feedback correction being respectively input to the first input end for the differential amplification to obtain the first correction data or the second correction data.

19. The detection apparatus as claimed in claim 18, wherein the sensor comprises a plurality of the differential amplification circuits, the plurality of the differential amplification circuits are sequentially and serially connected, and the first input end of a first differential amplification circuit in the plurality of differential amplification circuits is electrically connected to the sensing element; and the sensor comprises a plurality of the feedback correction circuits, and each of the plurality of the feedback correction circuit is electrically connected to the differential amplification circuits in one-to-one correspondence.

20. The detection apparatus as claimed in claim 15, wherein the sensor is a magnetic sensor or a thickness sensor.

* * * * *